(12) United States Patent
Grivna

(10) Patent No.: US 7,985,661 B2
(45) Date of Patent: Jul. 26, 2011

(54) SEMICONDUCTOR DIE SINGULATION METHOD

(75) Inventor: Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/749,370

(22) Filed: Mar. 29, 2010

(65) Prior Publication Data

US 2010/0184272 A1    Jul. 22, 2010

Related U.S. Application Data

(63) Continuation of application No. 11/834,924, filed on Aug. 7, 2007, now Pat. No. 7,781,310.

(51) Int. Cl.
*H01L 21/00* (2006.01)

(52) U.S. Cl. ........ 438/462; 438/113; 438/114; 438/460; 438/700; 438/704; 438/710; 438/745

(58) Field of Classification Search ................. 438/113, 438/114, 460, 462, 700, 704, 706, 710, 745, 438/FOR. 118, FOR. 386
See application file for complete search history.

(56) References Cited

U.S. PATENT DOCUMENTS

| | | | | |
|---|---|---|---|---|
| 4,820,377 A * | 4/1989 | Davis et al. | ...................... | 134/1.1 |
| 5,856,705 A * | 1/1999 | Ting | ................ | 257/758 |
| 5,863,813 A * | 1/1999 | Dando | ........................... | 438/114 |
| 6,140,151 A * | 10/2000 | Akram | ........................... | 438/113 |
| 6,165,814 A * | 12/2000 | Wark et al. | ...................... | 438/108 |
| 6,200,851 B1 * | 3/2001 | Arnold | ........................... | 438/243 |
| 6,214,703 B1 | 4/2001 | Chen et al. | | |
| 6,342,724 B1 * | 1/2002 | Wark et al. | ...................... | 257/532 |
| 6,563,204 B1 * | 5/2003 | Glenn | ............................ | 257/678 |
| 6,642,127 B2 | 11/2003 | Kumar et al. | | |
| 6,686,225 B2 | 2/2004 | Wachtler | | |
| 6,897,128 B2 | 5/2005 | Arita | | |
| 6,969,669 B2 | 11/2005 | Arita | | |
| 7,060,531 B2 | 6/2006 | Arita | | |
| 7,129,114 B2 | 10/2006 | Akram | | |
| 7,488,668 B2 | 2/2009 | Arita et al. | | |
| 7,629,228 B2 | 12/2009 | Haji et al. | | |
| 7,678,670 B2 | 3/2010 | Arita et al. | | |
| 7,767,551 B2 | 8/2010 | Arita et al. | | |
| 7,906,410 B2 | 3/2011 | Arita et al. | | |
| 2004/0102025 A1 | 5/2004 | Arita | | |
| 2005/0084996 A1 * | 4/2005 | Harper | ............................ | 438/33 |
| 2006/0030078 A1 * | 2/2006 | Jiang et al. | ..................... | 438/113 |
| 2007/0087524 A1 * | 4/2007 | Montgomery | ................ | 438/427 |
| 2007/0132034 A1 * | 6/2007 | Curello et al. | ................ | 257/374 |
| 2007/0148807 A1 * | 6/2007 | Akram | ............................ | 438/65 |
| 2008/0213977 A1 * | 9/2008 | Wyant | ........................... | 438/460 |
| 2009/0001609 A1 * | 1/2009 | Lim | ............................ | 257/782 |
| 2009/0057838 A1 | 3/2009 | Arita et al. | | |
| 2010/0048001 A1 | 2/2010 | Harikai et al. | | |
| 2010/0055875 A1 | 3/2010 | Haji et al. | | |
| 2010/0124246 A1 * | 5/2010 | Lutgen et al. | ................ | 372/50.1 |
| 2010/0173474 A1 | 7/2010 | Arita et al. | | |

FOREIGN PATENT DOCUMENTS

| | | | |
|---|---|---|---|
| WO | 2004066382 A1 | 8/2004 | |
| WO | 2007007883 A1 | 1/2007 | |
| WO | 2008081968 A1 | 7/2008 | |
| WO | 2009063620 A1 | 5/2009 | |

* cited by examiner

*Primary Examiner* — N Drew Richards
*Assistant Examiner* — Joannie A Garcia
(74) *Attorney, Agent, or Firm* — Robert F. Hightower

(57) ABSTRACT

In one embodiment, semiconductor die are singulated from a semiconductor wafer by etching openings completely through the semiconductor wafer.

19 Claims, 7 Drawing Sheets

SEMICONDUCTOR DIE SINGULATION METHOD

The present application is a continuation application of prior U.S. application Ser. No. 11/834,924, filed on Aug. 7, 2007 now U.S. Pat. No. 7,781,310, which is hereby incorporated herein by reference, and priority thereto for common subject matter is hereby claimed.

BACKGROUND OF THE INVENTION

The present invention relates, in general, to electronics, and more particularly, to methods of forming semiconductors.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel along scribe grids that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe all of the scribe grids on the entire semiconductor wafer could take over one hour. This time reduced the throughput and manufacturing capacity of a manufacturing area.

Another method of singulating individual semiconductor die used lasers to cut through the wafers along the scribe grids. However, laser scribing was difficult to control and also resulted in non-uniform separation. Laser scribing also required expensive laser equipment as well as protective equipment for the operators.

Accordingly, it is desirable to have a method of singulating die from a semiconductor wafer that increases the number of semiconductor die on the wafer, that provides more uniform singulation, that reduces the time to perform the singulation, and that has a narrower scribe line.

For simplicity and clarity of the illustration, elements in the figures are not necessarily to scale, and the same reference numbers in different figures denote the same elements. Additionally, descriptions and details of well-known steps and elements are omitted for simplicity of the description. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

Figure 1:
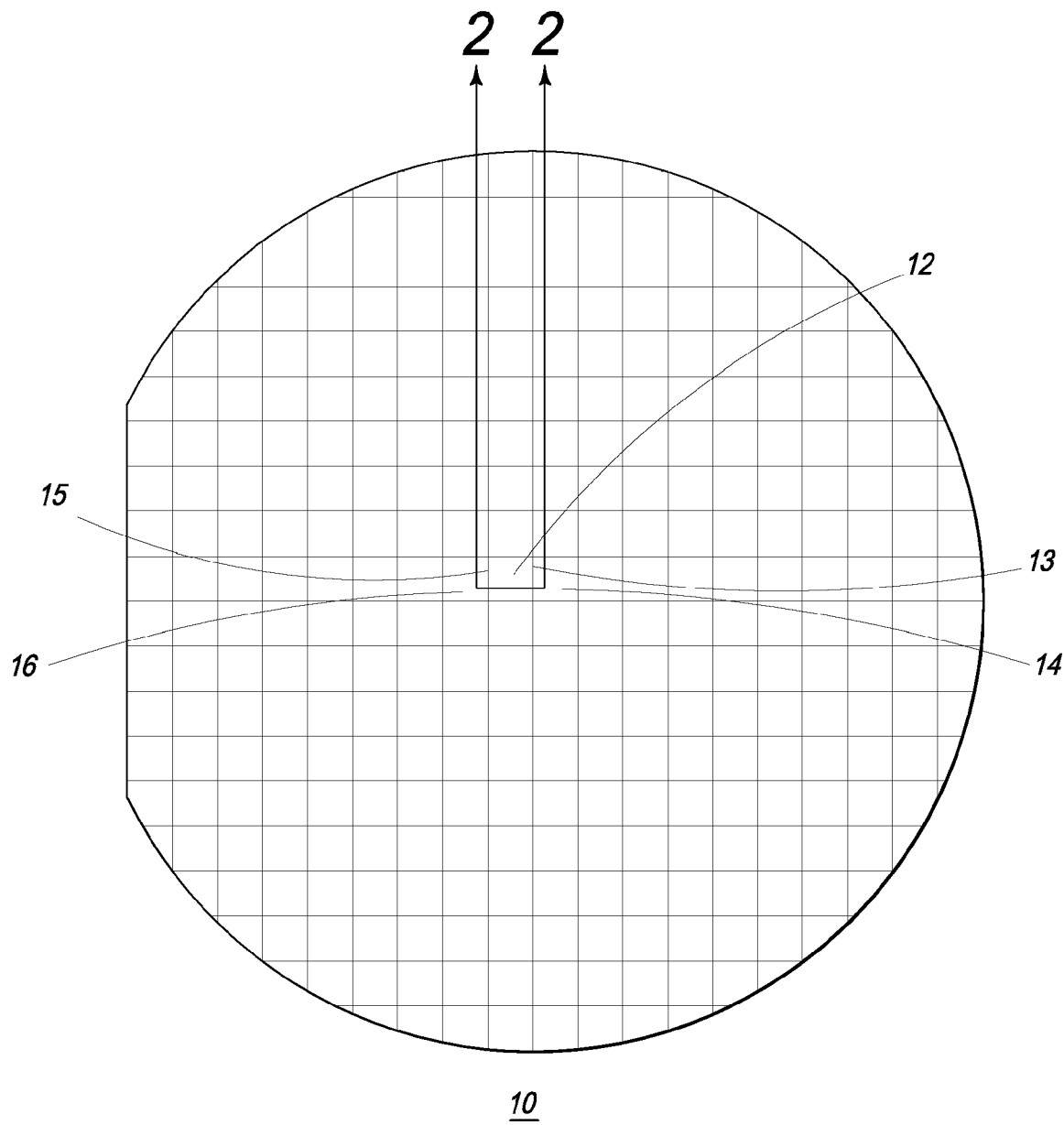
FIG. 1 illustrates a reduced plan view of an embodiment of a semiconductor wafer in accordance with the present invention.

FIG. 1 is a reduced plan view graphically illustrating a semiconductor wafer 10 that has a plurality of semiconductor die, such as die 12, 14, and 16, formed on semiconductor wafer 10. Die 12, 14, and 16 are spaced apart from each other on wafer 10 by spaces in which singulation lines are to be formed, such as singulation lines 13 and 15. As is well known in the art, all of the plurality of semiconductor die generally are separated from each other on all sides by areas where singulation lines such as lines 13 and 15 are to be formed.

Figure 2:
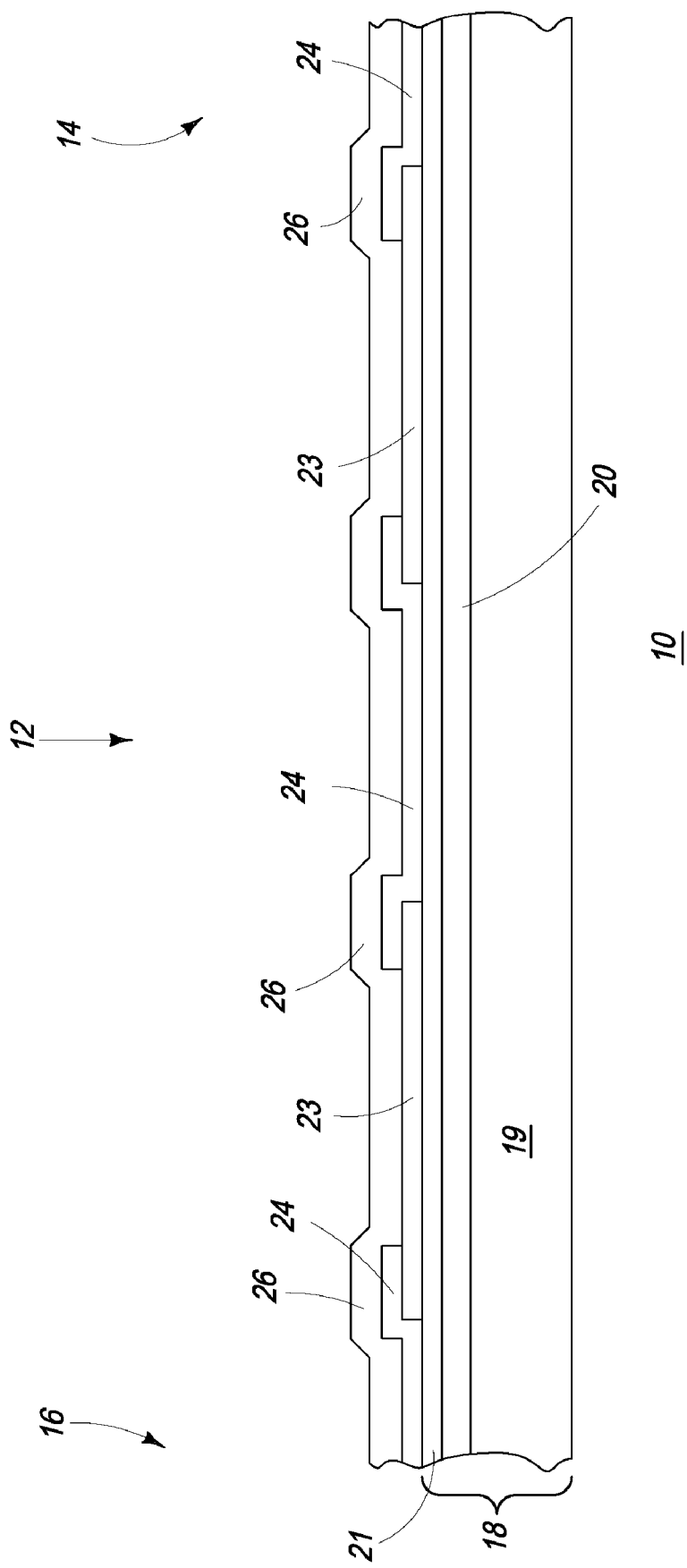
FIG. 2 illustrates a cross-sectional view of an embodiment of a portion of the semiconductor wafer of FIG. 1 at a stage in a process of singulating die from the wafer in accordance with the present invention.

FIG. 2 illustrates an enlarged cross-sectional portion of wafer 10 of FIG. 1 taken along section line 2-2. For clarity of the drawings and of the description, this section line 2-2 is illustrated to cross-section only die 12 and portions of dice 14 and 16. Die 12, 14, and 16 may be any type of semiconductor die including a vertical transistor, a lateral transistor, or an integrated circuit that includes a variety of types of semiconductor devices. Semiconductor dice 12, 14, and 16 generally include a semiconductor substrate 18 that may have doped regions formed within substrate 18 in order to form active and passive portions of the semiconductor die. The cross-sectional portion illustrated in FIG. 2 is taken along a contact pad 24 of each of dice 12, 14, and 16. Contact pad 24 generally is a metal that is formed on the semiconductor die in order to provide electrical contact between the semiconductor die and elements external to the semiconductor die. For example, contact pad 24 may be formed to receive a bonding wire that may subsequently be attached to pad 24 or may be formed to receive a solder ball or other type of interconnect structure that may subsequently be attached to pad 24. Substrate 18 includes a bulk substrate 19 that has an epitaxial layer 20 formed on a surface of bulk substrate 19. A portion of epitaxial layer 20 may be doped to form a doped region 21 that is used for forming active and passive portions of semiconductor die 12, 14, or 16. Layer 20 and/or region 21 may be omitted in some embodiments or may be in other regions of dice 12, 14, or 16. Typically, a dielectric 23 is formed on a top surface of substrate 18 in order to isolate pad 24 from other portions of the individual semiconductor die and to isolate each pad 24 from the adjacent semiconductor die. Dielectric 23 usually is a thin layer of silicon dioxide that is formed on the surface of substrate 18. Contact pad 24 generally is a metal with a portion of contact pad 24 electrically contacting substrate 18 and another portion formed on a portion of dielectric 23. After dice 12, 14, and 16 are formed including the metal contacts and any associated inter-layer dielectrics (not shown), a dielectric 26 is formed over all of the plurality of semiconductor die to function as a passivation layer for wafer 10 and for each individual semiconductor die 12, 14, and 16. Dielectric 26 usually is formed on the entire surface of wafer 10 such as by a blanket dielectric deposition. The thickness of dielectric 26 generally is greater than the thickness of dielectric 23.

Figure 3:
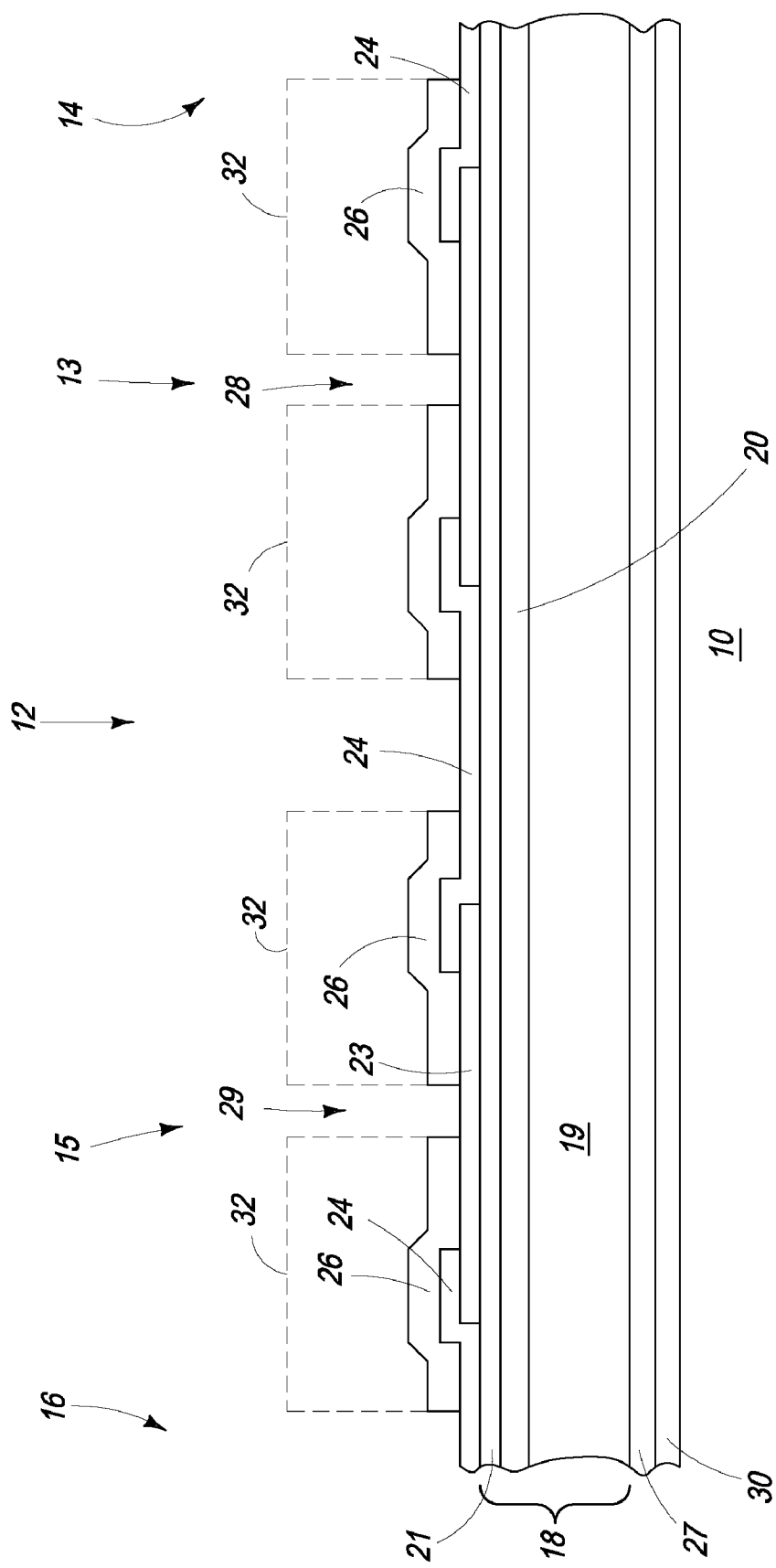
FIG. 3 illustrates a subsequent state in the process of singulating the die from the wafer of FIG. 1 in accordance with the present invention.

FIG. 3 illustrates the cross-sectional portion of wafer 10 in FIG. 2 at a subsequent stage in the process of singulating dice 12, 14, and 16 from wafer 10. After the passivation layer of dielectric 26 is formed, a mask 32, illustrated by dashed lines, may be applied to the surface of substrate 18 and patterned to form openings that expose portions of dielectric 26 overlying each pad 24 and also overlying portions of wafer 10 where the singulation lines, such as singulation lines 13 and 15, are to be formed. Thereafter, dielectric 26 is etched through the openings in mask 32 to expose the underlying surface of pads 24 and of substrate 18. The openings that are formed through dielectric 26 in the region where the singulation lines, such as lines 13 and 15, are to be formed function as singulation openings 28 and 29. The openings that are formed through dielectric 26 overlying pads 24 function as contact openings. The etching process preferably is performed with a process that selectively etches dielectrics faster than it etches metals. The etching process generally etches dielectrics at least ten (10) times faster that it etches metals. The material used for substrate 18 preferably is silicon and the material used for dielectric 26 preferably is silicon dioxide or silicon nitride. The material of dielectric 26 may also be other dielectric materials that can be etched without etching the material of pads 24, such as polyimide. The metal of pads 24 functions as an etch stop that prevents the etching from removing the exposed portions of pads 24. In the preferred embodiment, a fluorine based anisotropic reactive ion etch process is used.

After forming the openings through dielectric 26, mask 32 is removed and substrate 18 is thinned to remove material from the bottom surface of substrate 18 and reduce the thickness of substrate 18. Generally, substrate 18 is thinned to a thickness that is no greater than about one hundred to two hundred (100 to 200) microns. Such thinning procedures are well known to those skilled in the art. After wafer 10 is thinned, the backside of wafer 10 may be metalized with a metal layer 27. This metalization step may be omitted in some embodiments. After metalization, wafer 10 usually is attached to a transport tape or carrier tape 30 that facilitates supporting the plurality of die after the plurality of die are singulated. Such carrier tapes are well known to those skilled in the art.

Figure 4:
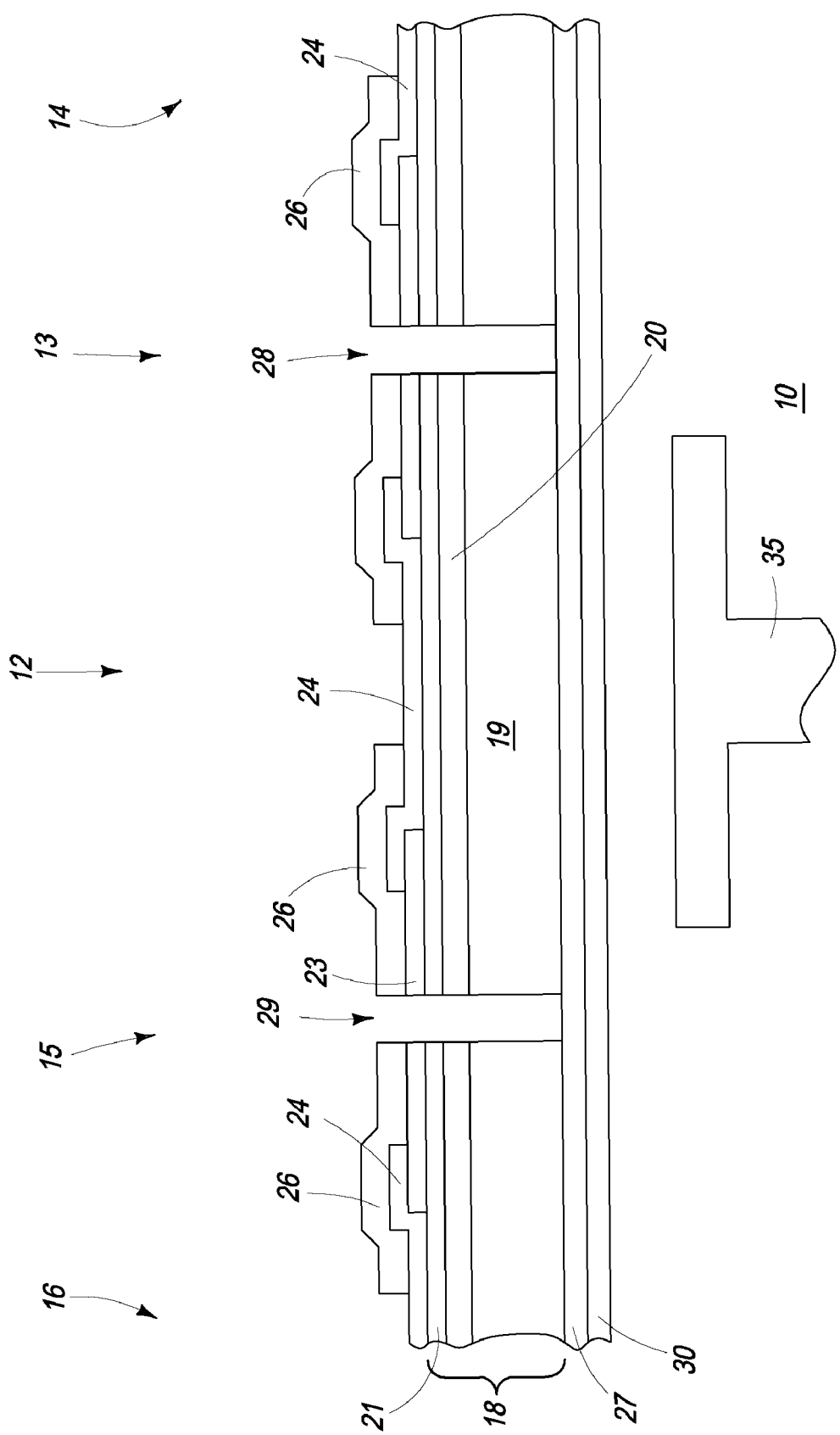
FIG. 4 illustrates another subsequent stage in the process of singulating the die from the wafer of FIG. 1 in accordance with the present invention.

FIG. 4 illustrates wafer 10 at a subsequent stage in the process of singulating semiconductor die 12, 14, and 16 from wafer 10. Substrate 18 is etched through singulation openings 28 and 29 that were formed in dielectric 26. The etching process extends singulation opening 28 and 29 from the top surface of substrate 18 completely through substrate 18. The etching process usually is performed using a chemistry that selectively etches silicon at a much higher rate than dielectrics or metals. The etching process generally etches silicon at least fifty (50) and preferably one hundred (100) times faster than it etches dielectrics or metals. Typically, a deep reactive ion etcher system which uses a combination of isotropic and anisotropic etching conditions is used to etch openings 28 and 29 from the top surface of substrate 18 completely through the bottom surface of substrate 18. In the preferred embodiment, a process commonly referred to as the Bosch process is used to anisotropically etch singulation openings 28 and 29 through substrate 18. In one example, wafer 10 is etched with the Bosch process in an Alcatel deep reactive ion etch system.

The width of singulation openings 28 and 29 is generally five to ten (5-10) microns. Such a width is sufficient to ensure that openings 28 and 29 can be formed completely through substrate 18 and are narrow enough to form the openings in a short time interval. Typically, openings 28 and 29 can be formed through substrate 18 within a time interval of approximately fifteen to thirty (15 to 30) minutes. Since all of the singulation lines of wafer 10 are formed simultaneously, all of the singulation lines can be formed across wafer 10 within the same time interval of approximately fifteen to thirty (15 to 30) minutes. Thereafter, wafer 10 is supported by carrier tape 30 as wafer 10 is taken to a pick-and-place equipment 35 that is utilized to remove each individual die from wafer 10. Typically, equipment 35 has a pedestal or other tool that pushes each singulated die, such as die 12, upward to release it from carrier tape 30 and up to a vacuum pickup (not shown) that removes the singulated die. During the pick-and-place process, the portion of thin back metal layer 27 that underlies openings 28 and 29 breaks away and is left behind on tape 30.

Figure 5:
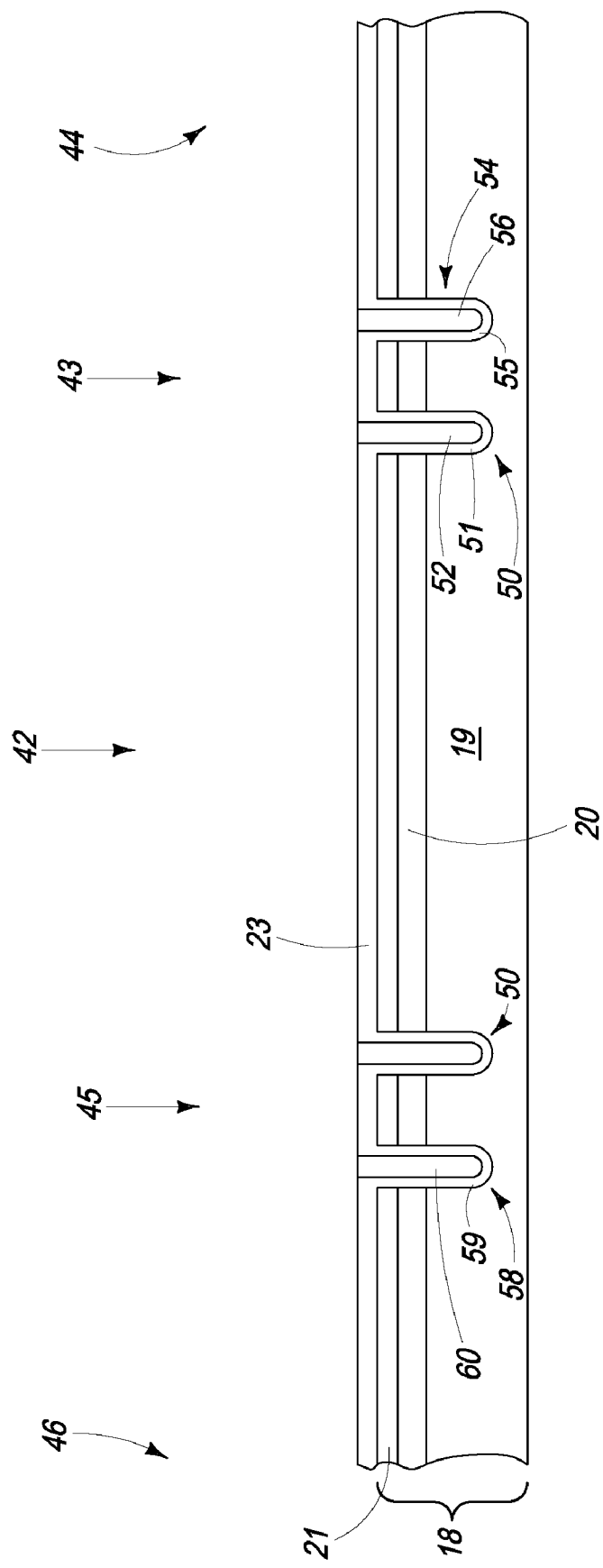
FIG. 5 illustrates an enlarged cross-sectional portion of semiconductor dice that are formed on the wafer of FIGS. 1-4 and that are alternate embodiments of the dice that are explained in the description of FIGS. 1-4.

FIG. 5 illustrates an enlarged cross-sectional portion of semiconductor dice 42, 44, and 46 that are formed on wafer 10 and that are alternate embodiments of dice 12, 14, and 16 that are explained in the description of FIGS. 1-4. Dice 42, 44, and 46 are illustrated at a manufacturing state after forming dielectric 23 on the top surface of substrate 18 and prior to forming pads 24 (FIG. 1). Dice 42, 44, and 46 are similar to dice 12, 14, and 16 except that dice 42, 44, and 46 each have a respective isolation trench 50, 54, and 58 that surround the die and isolate them from an adjacent die. Trenches 50, 54, and 58 generally are formed near an outside edge of each die. Trenches 50, 54, and 58 are formed to extend from the top surface of substrate 18 a first distance into bulk substrate 19. Each trench 50, 54, and 58 generally is formed as an opening into substrate 19 that has a dielectric formed on the sidewall of the opening and generally is filled with a dielectric or other material such as silicon or polysilicon. For example, trench 50 may include a silicon dioxide dielectric 51 on the sidewalls of the trench opening and may be filled with polysilicon 52. Similarly, trenches 54 and 58 include respective silicon dioxide dielectrics 55 and 59 on the sidewalls of the trench opening and may be filled with polysilicon 56 and 60. Singulation line 43 is to be formed between trenches 50 and 54, and singulation line 45 is to be formed between trenches 50 and 58. Trenches 50 and 54 are formed adjacent to singulation line 43, and trenches 50 and 58 are formed adjacent to singulation line 45. Methods of forming trenches 50, 54, and 58 are well known to those skilled in the art. It should be noted that trenches 50 and 54 are used as illustration only and could be any number of shapes, sizes, or combinations of isolation tubs or trenches.

Figure 6:
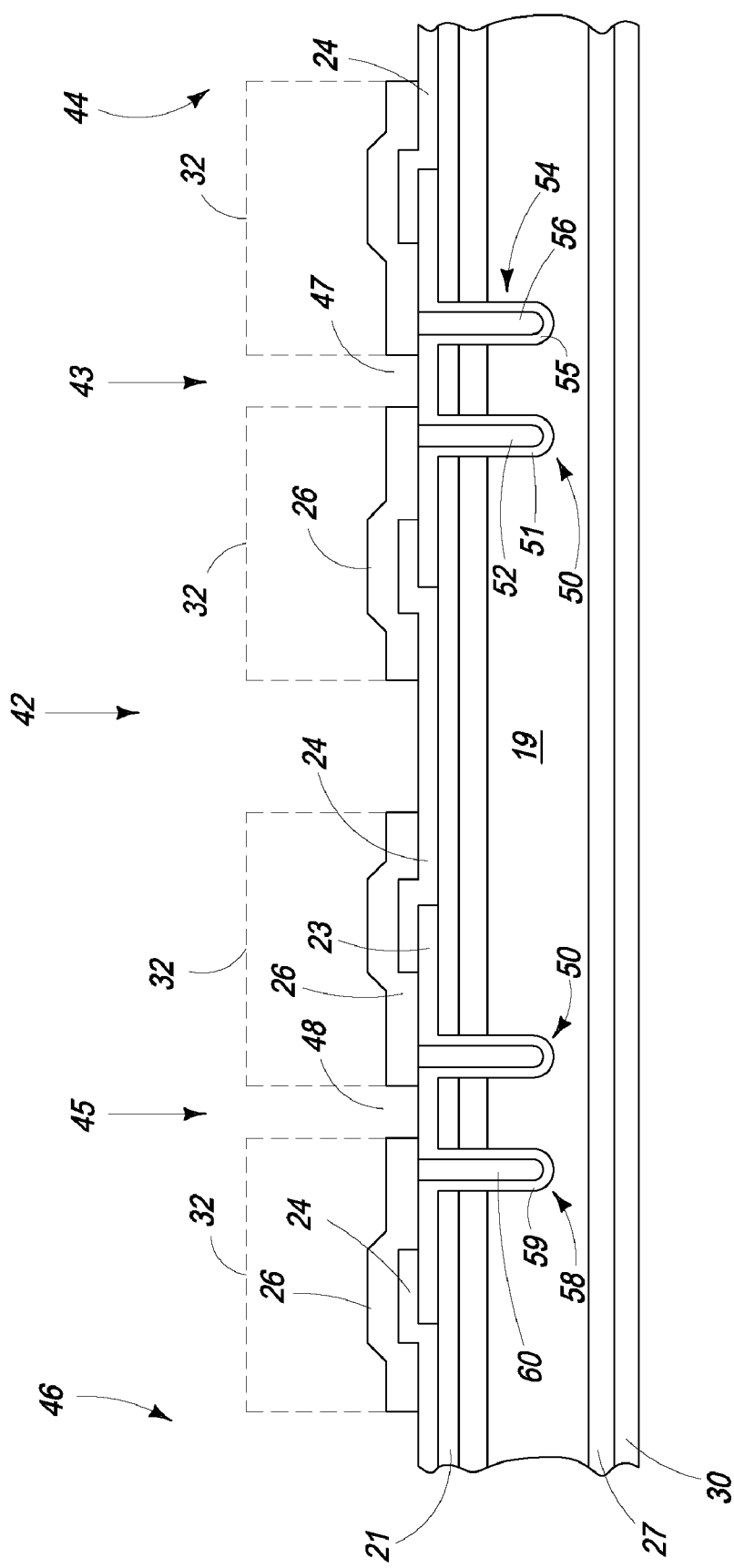
FIG. 6 illustrates a subsequent stage in the process of singulating the die of FIG. 6 in accordance with the present invention.

FIG. 6 illustrates wafer 10 at a subsequent stage in the process of singulating semiconductor dice 42, 44, and 46 from wafer 10. After trenches 50, 54, and 58 are formed, other portions of dice 42, 44, and 46 are formed including forming contact pads 24 and forming dielectric 26 covering dice 42, 44, and 46. Dielectric 26 generally also covers other portions of wafer 10 including the portion of substrate 18 where singulation lines 43 and 45 are to be formed. Thereafter, mask 32 is applied and patterned to expose underlying dielectric 26 where singulation lines and contact openings are to be formed. Dielectric 26 is etched through the openings in mask 32 to expose the underlying surface of pads 24 and of substrate 18. The openings that are formed through dielectric 26 in the region where the singulation lines, such as lines 43 and 45, are to be formed function as singulation openings 47 and 48. The etching process used to form openings 47 and 48 through dielectrics 23 and 26 is substantially the same as the process used to form openings 28 and 29 (FIG. 3) in dielectric 23 and 26. Openings 47 and 48 preferably are formed so that dielectrics 51, 55, and 59 on the sidewalls of respective trenches 50, 54, and 58 are not underlying openings 47 and 48 so that the dielectrics will not be affected in subsequent operations to form singulation lines 43 and 45.

After forming openings 47 and 48 through dielectric 26, mask 32 is removed and substrate 18 is thinned and metalized with metal layer 27 as explained hereinbefore in the description of FIG. 3. This metalization step may be omitted in some embodiments. After metalization, wafer 10 is usually attached to carrier tape 30.

Figure 7:
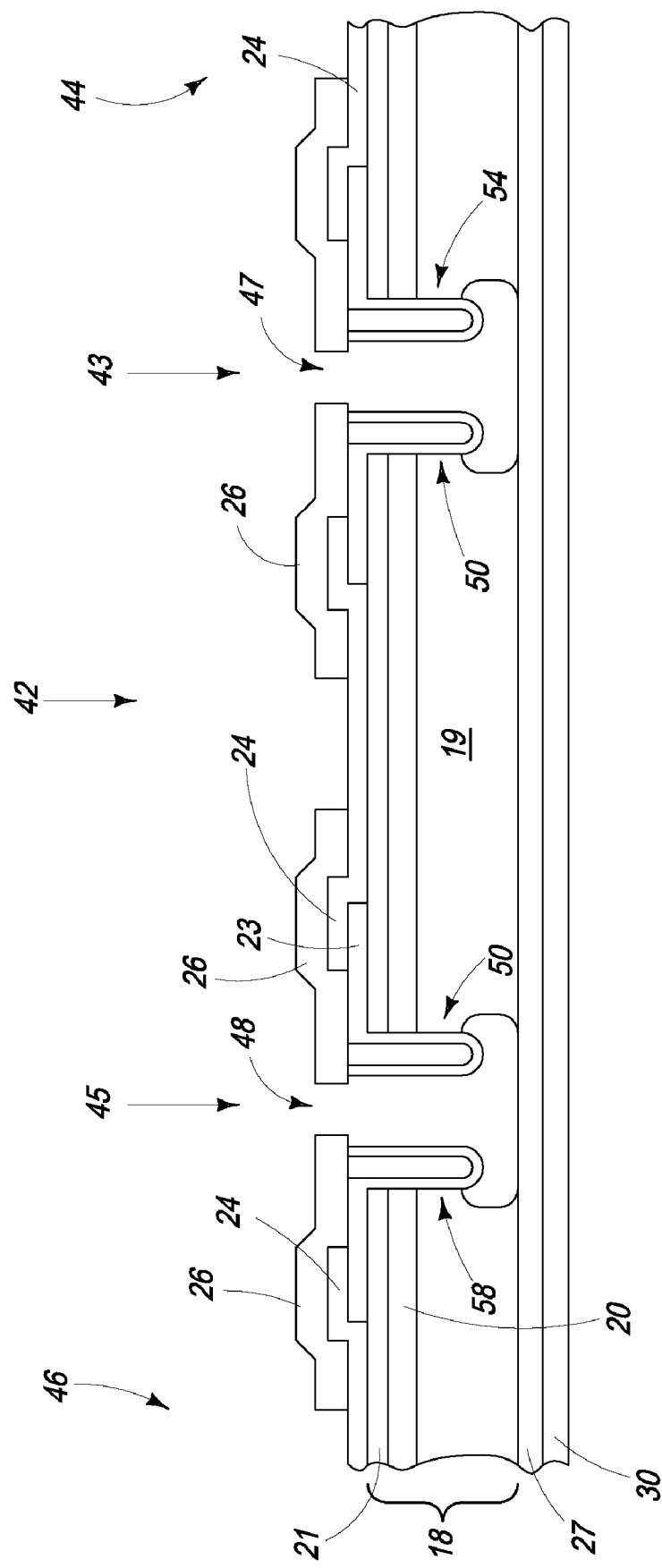
FIG. 7 illustrates another subsequent stage in the process of singulating the die of FIG. 6 in accordance with the present invention.

FIG. 7 illustrates wafer 10 at a subsequent stage in the process of singulating semiconductor die 42, 44, and 46 from wafer 10. Substrate 18 is etched through singulation openings 47 and 48 that were formed in dielectric 26. The etching process extends singulation opening 47 and 48 from the top surface of substrate 18 completely through substrate 18. Openings 47 and 48 usually are at least 0.5 microns from dielectrics 51, 55, and 59. The etching process usually is an isotropic etch that selectively etches silicon at a much higher rate than dielectrics or metals, generally at least fifty (50) and preferably at least one hundred (100) times faster. Since the dielectric on the sidewalls of the trenches protects the silicon of substrate 18, an isotropic etch can be used. The isotropic etch has a much higher etching throughput than can be obtained with the use of the BOSCH process or with limited use of the Bosch process. However, the isotropic etching typically undercuts portions of substrate 19 that are underlying trenches 50, 54, and 58. Typically, a down-stream etcher with a fluorine chemistry is used to etch openings 28 and 29 from the top surface of substrate 18 completely through the bottom surface of substrate 18 and expose a portion of layer 27 underlying openings 28 and 29. In one example, wafer 10 is etched in the Alcatel deep reactive ion etch system using full isotropic etching. In other embodiments, isotropic etching may be used for most of the etching and anisotropic etching may be used for another portion of the etching (the Bosch process). For example, isotropic etching may be used until openings 28 and 29 extend to a depth that is substantially the same depth as trenches 50, 54, and 58, and anisotropic etching may be used thereafter to prevent the undercutting of trenches 50, 54, and 58.

The width of singulation openings 43 and 45 is generally about the same as the width of openings 28 and 29. Dice 42, 44, and 46 may be removed from tape 30 similarly to the manner of removing dice 12, 14, and 16.

In view of all of the above, it is evident that a novel device and method is disclosed. Included, among other features, is etching singulation openings completely through a semiconductor wafer. Etching the openings from one side assists in ensuring that the singulation openings have very straight sidewalls thereby providing a uniform singulation line along each side of each semiconductor die. Etching the singulation openings completely through the semiconductor wafer facilitate forming narrow singulation lines thereby allowing room to use for forming semiconductor die on a given wafer size. The etching process is faster than ascribing process, thereby increasing the throughput of a manufacturing area.

While the subject matter of the invention is described with specific preferred embodiments, it is evident that many alternatives and variations will be apparent to those skilled in the semiconductor arts. For example, layers 20 and/or 21 may be omitted from substrate 18. The singulation openings alternately may be formed prior to or subsequent to forming the contact openings overlying pads 24. Also, the singulation openings may be formed before thinning wafer 10, for example, the singulation openings may be formed partially through substrate 18 and the thinning process may be used to expose the bottom of the singulation openings.

The invention claimed is:

1. A method of singulating semiconductor die from a semiconductor wafer comprising:
    providing the semiconductor wafer formed from a semiconducting material and having a plurality of semiconductor dies formed on a first surface of the semiconductor wafer and separated from each other by portions of the semiconductor wafer wherein the plurality of semiconductor dies include a dielectric layer covering portions of the plurality of semiconductor dies;
    etching a first opening through the dielectric layer and underlying layers to expose a portion of a surface of the semiconductor wafer;
    etching through the first opening to extend the first opening from the exposed portion of the surface of the semiconductor wafer into the semiconductor wafer; and
    attaching the semiconductor wafer to a carrier tape for supporting the plurality of semiconductor dies after the plurality of semiconductor dies are singulated wherein the attaching step is performed prior to the step of etching through the first opening to extend the first opening and remains attached during the step of etching through the first opening to extend the first opening.

2. The method of claim 1 wherein the step of etching through the first opening includes etching partially through the semiconductor wafer.

3. The method of claim 1 wherein providing the semiconductor wafer includes providing the semiconductor wafer having the dielectric that is formed from a material wherein etching of the dielectric does not etch a metal.

4. The method of claim 1 wherein providing the semiconductor wafer includes providing the semiconductor wafer having the plurality of semiconductor dies having a contact pad on the semiconductor dies and wherein a material of the contact pad is not etched by the etching of the dielectric.

5. The method of claim 1 wherein providing the semiconductor wafer formed from the semiconducting material includes providing the semiconductor wafer formed from silicon.

6. The method of claim 1 further including subsequent to the step of etching through the first opening, using pick-and-place equipment to separate a semiconductor die of the plurality of semiconductor dies from the carrier tape and from other die of the plurality of semiconductor dies.

7. A method of singulating semiconductor die from a semiconductor wafer comprising:
    providing the semiconductor wafer having a semiconductor material substrate and having a plurality of semiconductor dies formed on the semiconductor wafer and separated from each other by portions of the semiconductor wafer wherein the plurality of semiconductor dies include a dielectric layer as a top layer;
    etching a first opening through the dielectric layer to expose a surface of the semiconductor material substrate; and
    using the dielectric layer as a mask and etching through the first opening to extend a depth of the first opening through the portions of the semiconductor material substrate and into the semiconductor material substrate wherein the first opening extends from one surface of the semiconductor material substrate into the semiconductor material substrate thereby creating a space between the plurality of semiconductor dies including attaching the semiconductor wafer to a carrier tape prior to etching through the first opening to extend the depth of the first opening wherein the carrier tape remains attached during the step of etching the first opening.

8. The method of claim 7 wherein using the dielectric layer as the mask and etching through the first opening to extend the depth of the first opening through the portions of the semiconductor material substrate includes etching the opening from a first surface of the semiconductor material substrate through the semiconductor material substrate to a second surface that is opposite to the first surface.

9. The method of claim 7 wherein using the dielectric layer as the mask and etching through the first opening to extend the depth of the first opening through the portions of the semiconductor material substrate includes forming the opening with a width of less than 50 microns.

10. The method of claim 7 wherein using the dielectric layer as the mask and etching through the first opening to extend the depth of the first opening through the portions of the semiconductor material substrate includes etching the opening using an anisotropic etch.

11. The method of claim 7 wherein using the dielectric layer as the mask and etching through the first opening to extend the depth of the first opening through the portions of the semiconductor material substrate includes etching the opening using a combination of isotropic and anisotropic etch.

12. The method of claim 7 further including forming a conductor layer on a second surface of the semiconductor wafer prior to the step of using the dielectric layer as the mask, and wherein the step of using the dielectric layer as the mask includes not etching through the conductor layer that is on the second surface of the semiconductor wafer.

13. The method of claim 7 further including separating a semiconductor die of the plurality of semiconductor dies from other dies of the plurality of semiconductor dies wherein an edge of the first opening is an outside edge of the semiconductor die.

14. A method of singulating semiconductor die from a semiconductor wafer comprising:
   providing the semiconductor wafer formed from a semiconducting material and having a plurality of semiconductor dies formed on a first surface of the semiconductor wafer and separated from each other by portions of the semiconductor wafer wherein the plurality of semiconductor dies include a dielectric layer covering portions of the plurality of semiconductor dies;
   forming a first opening to expose a portion of a surface of the semiconductor wafer;
   etching through the first opening to extend the first opening from the exposed portion of the surface of the semiconductor wafer into the semiconductor wafer; and
   attaching the semiconductor wafer to a carrier tape for supporting the plurality of dies after the plurality of dies are singulated wherein the attaching step is performed prior to the step of etching through the first opening to extend the first opening and remains attached during the step of etching through the first opening to extend the first opening.

15. The method of claim 14 wherein the step of etching through the first opening includes etching partially through the semiconductor wafer.

16. The method of claim 14 wherein providing the semiconductor wafer includes providing the semiconductor wafer having the dielectric that is formed from a material wherein etching of the dielectric does not etch a metal.

17. The method of claim 14 wherein providing the semiconductor wafer includes providing the semiconductor wafer having the dielectric that is formed from polyimide.

18. The method of claim 14 wherein providing the semiconductor wafer includes providing the semiconductor wafer having the plurality of semiconductor dies having a contact pad on the semiconductor dies and wherein the dielectric is formed from a material wherein etching of the dielectric does not etch the contact pad.

19. The method of claim 14 further including subsequent to the step of etching through the first opening, using pick-and-place equipment to separate a semiconductor die of the plurality of semiconductor dies from the carrier tape and from other die of the plurality of semiconductor dies.

* * * * *